(12) United States Patent
van Mol et al.

(10) Patent No.: US 8,987,019 B2
(45) Date of Patent: Mar. 24, 2015

(54) METHOD OF MANUFACTURING AN OPTO-ELECTRIC DEVICE

(75) Inventors: Antonius Maria Bernardus van Mol, Eindhoven (NL); Joanne Sarah Wilson, Dordrecht (NL); Chia-Chen Fan, The Hague (NL); Herbert Lifka, Son en Breugel (NL); Edward Willem Albert Young, Maastricht (NL); Hieronymus A.J.M. Andriessen, Beerse (BE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/389,141

(22) PCT Filed: Aug. 6, 2010

(86) PCT No.: PCT/NL2010/050499
§ 371 (c)(1),
(2), (4) Date: Jul. 23, 2012

(87) PCT Pub. No.: WO2011/016725
PCT Pub. Date: Feb. 10, 2011

(65) Prior Publication Data
US 2012/0276734 A1    Nov. 1, 2012

(30) Foreign Application Priority Data

Aug. 6, 2009    (EP) .................................... 09167415

(51) Int. Cl.
*H01L 21/00*    (2006.01)
*H01L 51/52*    (2006.01)
*H01L 51/00*    (2006.01)

(52) U.S. Cl.
CPC ........ *H01L 51/5206* (2013.01); *H01L 51/5221* (2013.01); *H01L 51/003* (2013.01); *H01L 2227/326* (2013.01); *H01L 2251/5361* (2013.01)
USPC ................ 438/26; 438/82; 438/780; 257/40; 257/E51.022; 257/E23.007

(58) Field of Classification Search
CPC ................... H01L 2251/5338; H01L 51/0097; H01L 51/5206; H01L 51/5237; H01L 51/56; H01L 51/5221
USPC ............ 257/40, E51.022, E31.004, E23.007, 257/E23.018; 136/263; 438/82, 780, 26
See application file for complete search history.

(56) References Cited

U.S. PATENT DOCUMENTS 6,042,894 A * 3/2000 Goto et al. .................... 427/504
6,198,217 B1 * 3/2001 Suzuki et al. ................. 313/504
(Continued)

FOREIGN PATENT DOCUMENTS

CN    1727977    2/2006
EP    2202819    6/2010
(Continued)

OTHER PUBLICATIONS

International Search Report for PCT/NL2010/050499, mailed Nov. 18, 2010.

*Primary Examiner* — Marvin Payen
*Assistant Examiner* — Victor Barzykin
(74) *Attorney, Agent, or Firm* — Patterson Intellectual Property Law, P.C.; James R. Cartiglia

(57) ABSTRACT

A method of manufacturing an opto-electric device is disclosed, comprising the steps of providing a substrate (10), overlying a first main side of the substrate with an electrically interconnected open shunting structure (20), embedding the electrically interconnected open shunting structure in a transparent layer (30), removing the substrate from the embedded electrically interconnected open shunting structure, depositing a functional layer structure (40) over a free surface (31) formed after removal of the substrate.

16 Claims, 10 Drawing Sheets

(56) References Cited

U.S. PATENT DOCUMENTS

| | | |
|---|---|---|
| 7,473,331 B2 * | 1/2009 | Ivkovich et al. ............... 156/236 |
| 2001/0015620 A1 | 8/2001 | Affinito |
| 2003/0127973 A1 | 7/2003 | Weaver et al. |
| 2003/0160243 A1 | 8/2003 | Middelman et al. |
| 2003/0203210 A1 * | 10/2003 | Graff et al. ..................... 428/412 |
| 2005/0094394 A1 | 5/2005 | Padiyath et al. |
| 2006/0022199 A1 | 2/2006 | Ishiga et al. |
| 2006/0131703 A1 * | 6/2006 | Majumdar et al. ............. 257/665 |
| 2007/0079869 A1 * | 4/2007 | Yukinobu ....................... 136/263 |
| 2007/0194708 A1 * | 8/2007 | Van Mol et al. ............... 313/512 |
| 2009/0004772 A1 * | 1/2009 | Jinbo et al. ...................... 438/99 |
| 2010/0203235 A1 * | 8/2010 | Verschuuren et al. .......... 427/66 |
| 2012/0064318 A1 * | 3/2012 | Keite-Telgenbuscher et al. ............................ 428/216 |
| 2013/0069050 A1 * | 3/2013 | Laurent et al. .................. 257/40 |

FOREIGN PATENT DOCUMENTS

| | | |
|---|---|---|
| JP | 2003282241 | 10/2003 |
| JP | 2006236626 | 9/2006 |
| JP | 2009146640 | 7/2009 |
| WO | 03094256 | 11/2003 |
| WO | 2005096405 | 10/2005 |
| WO | 2007036850 | 4/2007 |
| WO | 2007041116 | 4/2007 |
| WO | 2007070778 | 6/2007 |
| WO | 2009004560 | 1/2009 |
| WO | 2009007899 | 1/2009 |

* cited by examiner

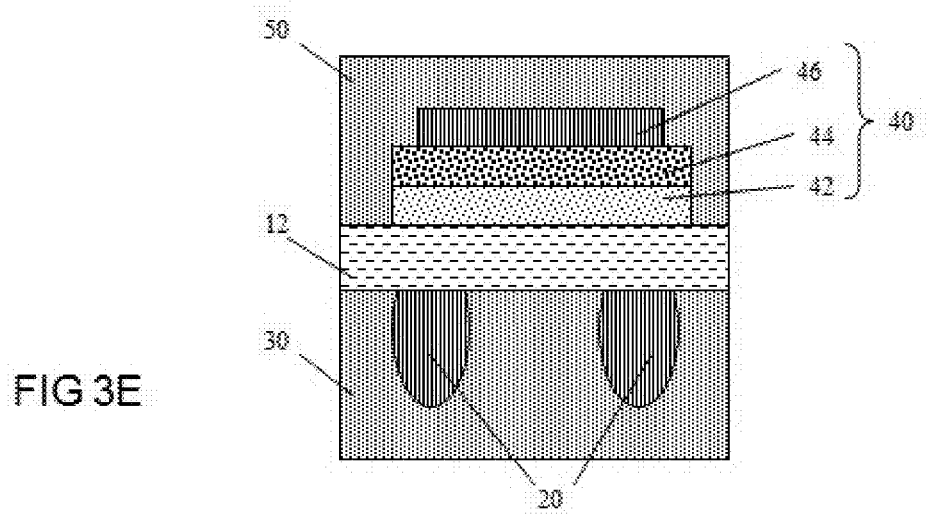
FIG 3E
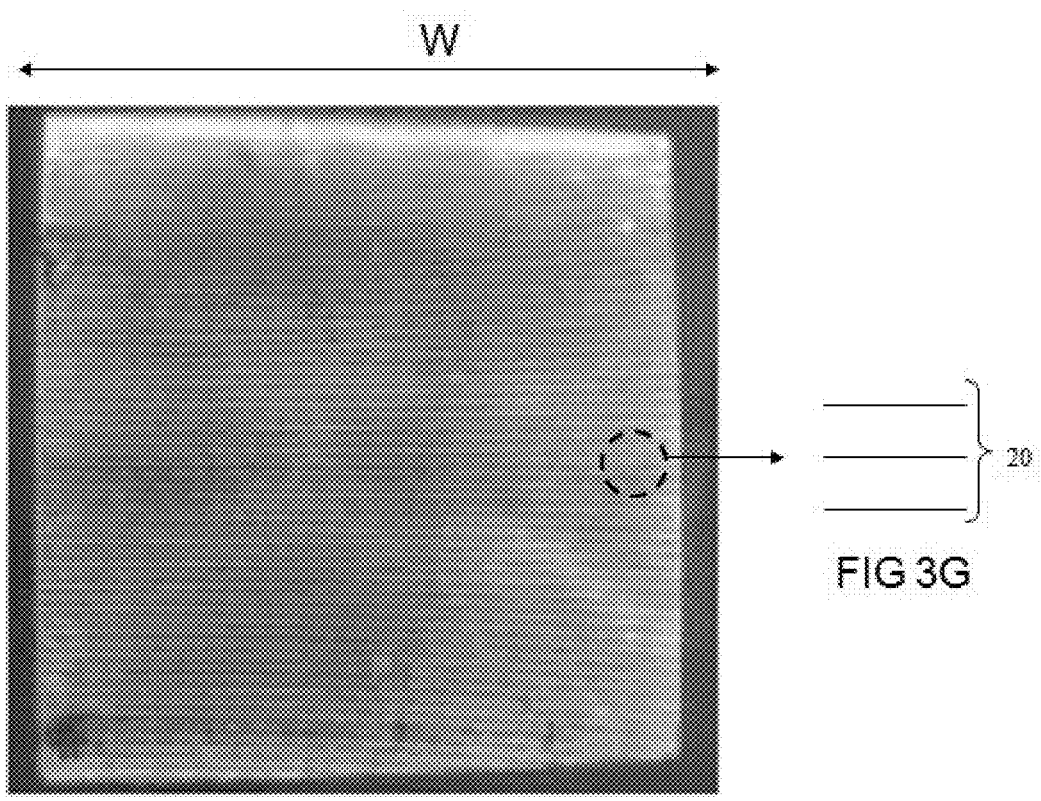
FIG 3F
FIG 3G

METHOD OF MANUFACTURING AN OPTO-ELECTRIC DEVICE

BACKGROUND OF THE INVENTION

1. Field of the Invention

The present invention relates to a method of manufacturing an opto-electric device.

2. Related Art

An opto-electric device is a device that provides for an optical effect in response to an electric signal, or that generates an electric signal in response to an optical stimulus. Examples of the first are light emitting diodes, such as organic light emitting diodes and electro chromic devices. Examples of the second are photo voltaic cells and optical sensors.

For large area OLED lighting on flexible plastic substrates, a large current is required to drive the system. The present thin film materials used for the anode (e.g. ITO) and cathode (e.g. Ba/Al) have a large resistivity and the large currents give rise to a substantial voltage drop, resulting in an inhomogeneous light emission. For producing large area flexible OLED devices on plastic substrates there is a need for additional shunting structure of the plastic substrate. Accordingly, for opto-electric devices, such as light emitting devices and electro-chromic devices, but also for photo-voltaic products there is a need for a shunting structure that on the one hand has a good electrical conductivity, while on the other hand has a high transmission for radiation.

The shunting structure should provide for a relatively high electrical conductance as compared to the transparent electrically conductive layer, but should not hinder transmission of light to or from the functional layer too much. In order to achieve a good transmission for photon radiation the shunting structure usually is formed of elongate elements, e.g. arranged in a maze-like structure that have a relatively small width (i.e. their dimension in a plane parallel to the transparent electrical conductive layer and transverse to their length). In order to achieve a sufficient electrical conductivity the elongate elements should have a relatively large height (transverse to the plane defined by the transparent electrically conductive layer). Due to the height profile of such a shunting structure it is difficult to deposit the functional layers of the device thereon. Care has to be taken to prevent shortcuts between protruding parts of the shunting layer and an electrode layer opposite the electrode layer shunted by the shunting structure. On the other hand if the shunting structure is applied after the functional layer structure, care has to be taken not to damage the functional structure by exposing it to heat or moisture.

SUMMARY OF THE INVENTION

Accordingly it is a purpose of the present invention to provide an improved method of providing an opto-electric device having a shunting structure that supports the transparent electrically conductive layer.

According to a first aspect of the present invention there is provided a method of manufacturing an opto-electric device, comprising the steps of
  providing a substrate,
  overlying a first main side of the substrate with an electrically interconnected open shunting structure,
  embedding the electrically interconnected open shunting structure in a transparent layer,
  removing the substrate from the embedded electrically interconnected open shunting structure.

An embodiment of the method according to the first aspect of the present invention comprises the step of depositing a functional layer structure over a free surface formed after removal of the substrate. The functional layer structure may for example comprise a luminescent layer, a photo-voltaic layer or an electrochrome layer. Also auxiliary layers, such as charge carrier injection layers and transport layers may be added.

In the method according to the first aspect of the invention, a substantially flat surface is obtained after the step of removing the substrate from the embedded electrically conductive interconnected open shunting structure, hereinafter also denoted as "shunting structure". This facilitates a uniform deposition of the functional layer structure of the opto-electric device. The non-uniformity of the shunting structure when embedding it in the transparent layer is not a problem as there is no risk of shortcuts. Moreover the transparent layer can be a planarizing layer, or comprise a planarizing sublayer, for example an organic layer. As the electrically conductive interconnected open pattern is formed on a temporary substrate and not on the functional layer structure, various deposition methods are suitable that otherwise could have been harmful to the functional layer structure.

In an embodiment of the method according to the first aspect of the invention the transparent layer is a barrier layer. This is advantageous in that a separate barrier layer at the side of the shunting structure is not necessary. In particular for OLED devices a barrier layer is desired to prevent deterioration of the device by moisture in the environment. Barrier layers typically comprise a stack of sub-layers of at least two different materials that alternate each other. A second barrier layer may be deposited at the opposite side of the device and may form an enclosure that fully encapsulates the device. Alternatively the encapsulation may be completed by an edge sealing. For some types of devices e.g. for some types of photo-voltaic devices a barrier layer is not necessary.

An embodiment of the method according to the first aspect of the present invention comprises the step of depositing at least one intermediate layer at the first side of the substrate before overlying that side of the substrate with the electrically interconnected open shunting structure. One or more intermediate layers may be deposited at the metal substrate before the electrically conductive pattern is applied. This is in particularly advantageous in case the intermediate layer has to be applied using process conditions that are unfavourable for direct deposition on a heat sensitive substrate such as a polymer substrate. Such an intermediate layer is for example a transparent electrically conductive layer. Typically such layers, e.g. layers of a conductive metal oxide, e.g. fluor doped tinoxide can best be applied at relatively high temperatures, which would be disastrous for a heat sensitive substrate such as a polymer substrate.

In an embodiment of the method according to the first aspect of the present invention the substrate comprises a metal or a metal alloy and the substrate is removed by etching. A metal or metal alloy, such as aluminum, titanium, copper, steel, iron, nickel, silver, zinc, molybdenum, chromium and alloys thereof, can withstand high process temperatures. Various agents are suitable for etching the substrate, such as an acid or a base such as nitric acid, sulphuric acid, sodium hydroxide (NaOH) or potassium hydroxide.

In the absence of an intermediate layer the metal substrate may be removed from the shunting structure if different materials are used for the substrate and for the shunting structure, and the material used for the substrate has a substantially higher sensitivity for the etching agent than the metal of the shunting structure. An example thereof is the metal aluminum for the substrate, the metal silver for the shunting structure and NaOH as the etching agent.

If an intermediate layer is deposited at the substrate before the shunting structure, this may serve as a stop layer. In that case metal from the substrate and the shunting structure may be arbitrary selected from the metals mentioned above. If desired the same metal may be used for the substrate as for the shunting layer. The intermediate layer may be a transparent electrically conductive layer. Therewith the intermediate layer serves a dual purpose, i.e. it serves both as a transparent electrode and as a stop layer.

The temporary substrate is not necessarily of a metal. Alternatively other materials may be used that may be removed after deposition of the shunting layer. For example a polymer layer may be used as the temporary substrate. The polymer layer may be removed by dissolving it.

In an embodiment of the method according to the first aspect of the present invention the electrically interconnected open shunting structure is provided by electro deposition. The process of electro deposition is difficult to carry out in the presence of the functional layer, as the moisture to be used affects the functional layer. In the method of the present invention, the functional layer is not present yet when applying the electrically conductive interconnected open pattern, so that the functional layer cannot be damaged.

In another embodiment of the method according to the first aspect of the present invention the electrically interconnected open shunting structure is provided by
  depositing a liquid substance at the substrate in an interconnected open structure,
  curing the liquid substance, the interconnected open structure formed by the cured liquid substance being electrically conductive.
The process of curing is preferably carried out at high temperature. Therewith damage of the functional layer or a polymer substrate would probably occur. However when manufacturing the device according to the present invention this is not the case as the functional layer is not present yet when curing the electrically conductive interconnected open structure.

In still another embodiment of the method according to the first aspect of the present invention the electrically interconnected open shunting structure is provided by depositing a continuous layer of a metal at the substrate and patterning the deposited layer.

The transparent layer wherein the shunting structure is embedded may comprise a polymer layer. The polymer layer may serve as a support for the product. During handling of the product in a roll to roll process a polymer layer having a thickness of about 1 μm already provides for sufficient strength. However, for use in a consumer product a greater thickness is required. This may be realized by including a sufficiently thick polymer layer in the transparent layer e.g. a layer having thickness of some tens of μm. Also at an opposite side of the device such a layer may be provided. Alternatively a polymer foil is laminated over the transparent layer. Laminating a polymer foil, e.g. a PEN or PET foil having a thickness of about 100 μm can be realized very time efficiently.

An embodiment of the method according to the first aspect of the present invention comprises the step of overlying the first side of the substrate with an additional electrically interconnected open shunting structure. The additional shunting structure can support a further electrode.

BRIEF DESCRIPTION OF THE DRAWINGS

These and other aspects are described in more detail with reference to the drawing. Therein:

FIG. 2A illustrates a first step,
FIG. 2B illustrates a second step,
FIG. 2C illustrates a third step,
FIG. 2D illustrates a fourth step,
FIG. 2E illustrates a fifth step,
FIG. 3E illustrates a fifth step,
FIG. 3F is a photograph of a device obtained with the method of FIGS. 3A to 3E,
FIG. 3G shows a detail of FIG. 3F,
FIG. 5A illustrates a semifinished product in a first stage of the method,
FIG. 5B illustrates a view according to B in FIG. 5A,
FIG. 5C illustrates a semifinished product in a second stage of the method,
FIG. 5D illustrates a semifinished product in a third stage of the method,
FIG. 5E illustrates a semifinished product in a fourth stage of the method,
FIG. 5F illustrates a semifinished product in a fifth stage of the method.

DETAILED DESCRIPTION OF EMBODIMENTS

Figure 1:
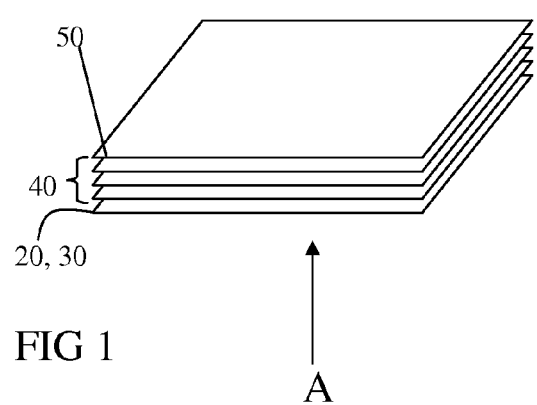
FIG. 1 schematically shows a thin-film opto-electric device obtainable with a method according to the present invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention. As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a layer of discrete active regions comprising individual pixels.

The opto-electric device is locally planar but may be curved in arbitrary shape on a more global scale. In practice a flat thin film device having a thickness D may be curved up to a radius of 50 times the thickness D. Alternatively the thin-film device according to the present invention may be manufactured in an initially curved shape. On the local scale the plane of the barrier layer structure defines lateral dimensions. The height of the structure is defined transverse to the plane.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In case of conflict, the present specification, including definitions, will control. In addition, the materials, methods, and examples are illustrative only and not intended to be limiting.

Figure 1A:
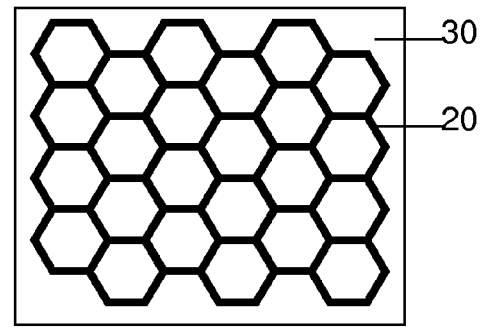
FIG. 1A shows a first shunting structure for use in a thin-film opto-electric device.

FIG. 1 schematically shows a thin-film opto-electric device. The device comprises a functional layer structure 40 that may comprise a plurality of functional layers. The functional layers include at least a first and a second electrode layer and an opto-electric layer arranged between said electrode layers. At least one of the electrode layers is shunted by an electrically interconnected open shunting structure 20 that is embedded in a transparent layer 30 as is shown in more detail in FIG. 1A. The shunting structure 20 substantially extends in a plane parallel to the layers. The shunting structure 20 is open, i.e. the material of the shunting structure occupies a relative surface area of not more than ⅓ of the area of the plane and the material is regularly distributed at a scale larger than 1 cm, i.e. portions of this size have substantially the same distribution. In the embodiment shown in FIG. 1A the shunting structure is in the form of a hexagonal maze. Alternatively another type of maze may be used, e.g. a rectangular maze.

Figure 1B:
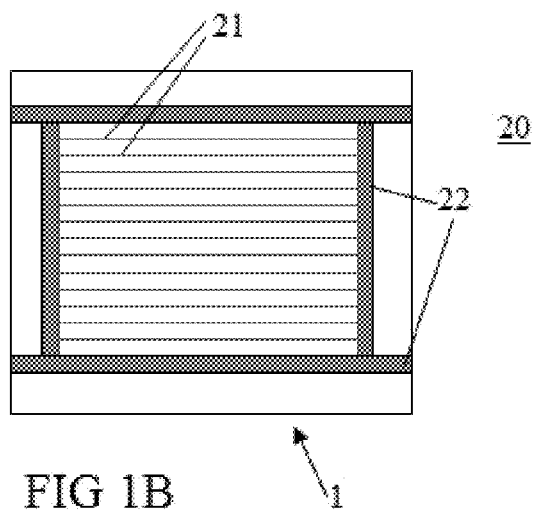
FIG. 1B shows a second shunting structure for use in a thin-film opto-electric device.

Also other topologies may be used as indicated in FIGS. 1B-1E. In FIG. 1B the open, electrically interconnected conductive structure 20 comprises a plurality of elongated elements 21 of a metal that laterally extend over the full width of the device and that are mutually connected by bus-bars 22 of an electrically conducting frame to facilitate an electrical contact with the device.

The elongated elements 21 for example have a width in the range of 1 to 200 µm, in particular in a range from 10 to 500 µm, e.g. 50 µm. The busbars 22 have a width in the range of 1 to 5 mm, for example 1 mm.

Figure 1C:
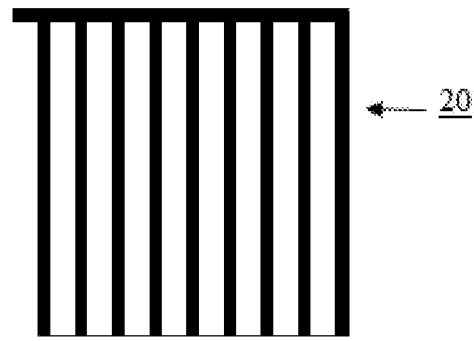
FIG. 1C shows a third shunting structure for use in a thin-film opto-electric device.

In FIG. 1C, the at least one electrically conductive structure 20 is a comb structure.

Figure 1D:
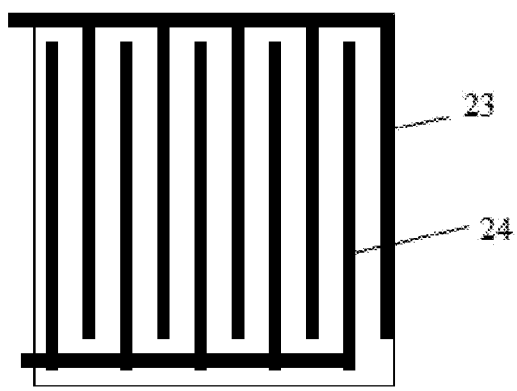
FIG. 1D shows a fourth shunting structure for use in a thin-film opto-electric device.

FIG. 1D shows a pair of electrically conductive structures 23, 24, each in the form of a comb structure, and gripping into each other.

Figure 1E:
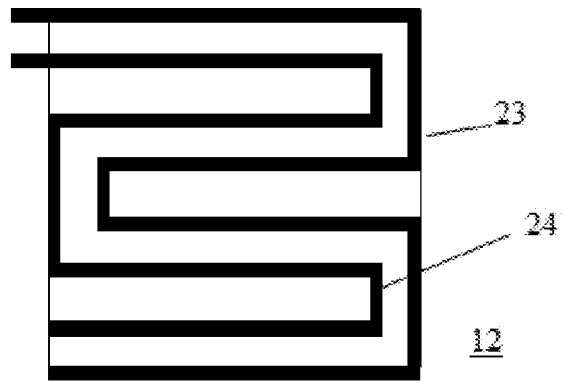
FIG. 1E shows a fifth shunting structure for use in a thin-film opto-electric device.

FIG. 1E shows an example wherein a plurality of meandering electrically conductive structures 23, 24 is arranged. In the example a pair of conductors is shown that may for example each carry a polarity of a power source. However, additional electrically conductive structures may be present, for example to carry control signals. FIGS. 2A to 2E illustrate a method according to the first aspect of the present invention.

Figure 2A:
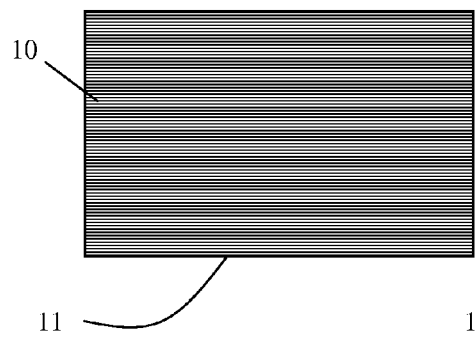
FIGS. 2A to 2E illustrate a method according to the first aspect of the present invention, therein

FIG. 2A shows a first step (S1) wherein a substrate 10 is provided. The substrate may be a metal or metal alloy. Suitable metals are for example, aluminum, titanium, copper, steel, iron, nickel, silver, zinc, molybdenum, chromium and alloys thereof.

In the embodiment shown the substrate has a height H that is chosen in the range of 20 to 500 µm. If the height H is substantially smaller than 20 µm, e.g. 10 µm, the metal substrate will be relatively fragile, and therewith difficult to handle in an industrial process. If the height H is substantially greater than 500 µm, e.g. 1 mm, the metal substrate will be relatively stiff and therewith also difficult to handle in an industrial process using roll to roll methods. Alternatively a metal coated polymer foil or a metal coated glass layer may be used as the substrate. Moreover, this will result in a long process time in a subsequent step (S4). In this case the substrate is an aluminum foil having a thickness of 0.125 mm.

Figure 2B:
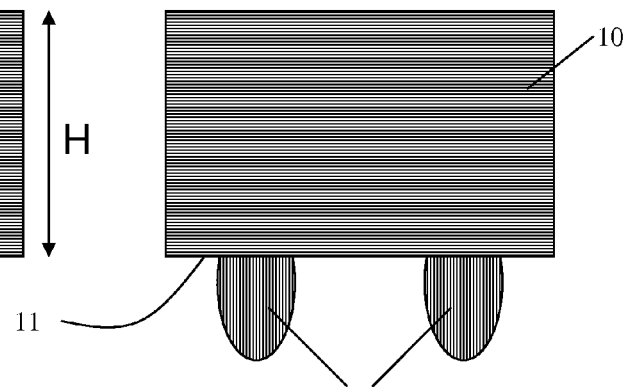

FIG. 2B shows a second step (S2) of overlying the substrate 10 at a first side 11 with an electrically interconnected open shunting structure 20. In this embodiment this step comprises a first substep of applying a precursor material using a patterning deposition method, such as a printing method, e.g. by gravure printing or rotary screen printing. With this substep the precursor material is applied in the pattern desired for the shunting structure, for example a pattern as illustrated in one of the FIGS. 1A to 1E. Subsequently the patterned layer so applied is cured in a second substep of S2 by supplying energy to the patterned layer, e.g. by heating or irradiating the layer. In particular when a metal substrate 10 is used this process can take place at a relatively high temperature. This is favourable, as it allows for a rapid curing of the patterned layer. Typically the patterned layer has mutually connected elongate elements with a height of 2-10 μm and a width of 10 to 100 μm. In the embodiment shown in FIG. 2F the height is 2-10 μm and the width is about 100 μm. A printable substance is for example an ink containing metal nano particles. An example thereof is a silver nanoparticle dispersion in an ethylene glycol/ethanol mixture as provided by Cabot (Cabot Printing Electronics and Displays, USA). This silver ink contains 20 wt % of silver nanoparticles, with the particle diameter ranging from 30 to 50 nm. The viscosity and surface tension of this ink is 14.4 mPa.s and 31 mN m$^{-1}$, respectively.

Alternatively metal complexes in organic or water based solvents may be used as the substance, for example silver complex inks comprising a mixture of solvents and silver amides, for example inks produced by InkTech. The silver amides decompose at a certain temperature between 130-150° C. into silver atoms, volatile amines and carbon dioxide. Once the solvents and the amines are evaporated, the silver atoms remain on the substrate. Other metal complexes based for example on copper, nickel, zinc, cobalt, palladium, gold, vanadium, and bismuth instead of silver may be used alternatively or in combination.

Furthermore conductive pastes, with various compositions, may be used instead of inks containing metal nano particles and/or metal complex inks.

Figure 2C:
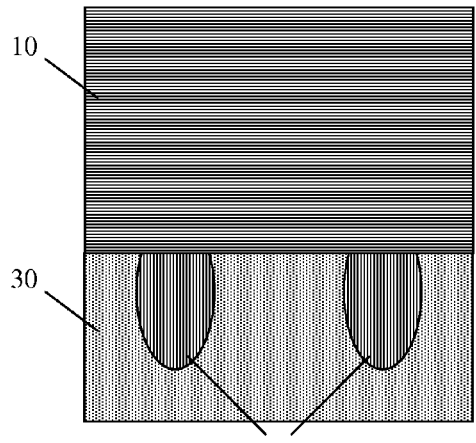

FIG. 2C shows a third step, wherein the shunting structure 20 is embedded in a transparent layer 30. In the embodiment shown the transparent layer 30 is a barrier layer. In the embodiment shown the barrier layer 30 is a stack subsequently comprising a first inorganic sublayer, an organic layer and a second inorganic sublayer. The stack may comprise further organic and inorganic sublayers.

The organic sublayers may be provided from a cross-linked (thermoset) material, an elastomer, a linear polymer, or a branched or hyper-branched polymer system or any combination of the aforementioned, optionally filled with inorganic particles of a size small enough to still guarantee light transmission. The material is processed either from solution or as a 100% solids material. Curing or drying may exemplary occur by irradiation of the wet material, pure, or suitably formulated with a photo- or heat-sensitive radical or super-acid initiator, with UV-light, visible light, infrared light or heat, E-beam, g-rays or any combination of the aforementioned. The material of the organic layer preferably has a low specific water vapour transmission rate and a high hydrophobicity. Examples of suitable cross-linking (thermoset) systems are any single one or any combination of aliphatic or aromatic epoxy acrylates, urethane acrylates, polyester acrylates, polyether acrylates, saturated hydrocarbon acrylates, epoxides, epoxide-amine systems, epoxide-carboxylic acid combinations, oxetanes, vinyl ethers, vinyl derivatives, and thiol-ene systems. Suitable examples of elastomeric materials are polysiloxanes. Examples of suitable branched or linear polymeric systems are any single one or any copolymer or physical combination of polyacrylates, polyesters, polyethers, polypropylenes, polyethylenes, polybutadienes, polynorbornene, cyclic olefin copolymers, polyvinylidenefluoride, polyvinylidenechloride, polyvinylchloride, polytetrafluoroethylene, polychlorotrifluoroethylene, polyhexafluoropropylene. The organic sublayer(s) may have a thickness between 0.1-200 μm, preferably between 5 and 50 μm.

The inorganic sublayers may be any transparent ceramic including but not limited to silicon oxide ($SiO_2$), aluminum oxide ($Al_2O_3$), titanium oxide ($TiO_2$), indium oxide ($In_2O_3$), tin oxide ($SnO_2$), indium tin oxide (ITO, $In_2O_3+SnO_2$), (SiC), silicon oxynitride (SiON) and combinations thereof.

The inorganic layer(s) are in practice substantially thinner than the organic layers. The inorganic layers should have a thickness in the range of 10 to 1000 nm, preferably in the range of 100 to 300 nm.

The total thickness of the first and the second barrier layer is preferably at least 50 μm. At a thickness substantially smaller than 50 μm, e.g. 20 μm, the resulting encapsulated electronic device tends to damage too quickly. Preferably the total thickness is less than 500 μm. If the thickness is substantially more, e.g. 1 mm, the flexibility of the product is impaired.

In step S4, after the shunting structure is embedded, the substrate 10 is removed from the embedded electrically interconnected open shunting structure. In case the substrate 10 is a metal foil it may be removed by etching with an acid or a base such as nitric acid, sulphuric acid, sodium hydroxide (NaOH) or potassium hydroxide (KOH).

In the embodiment shown, wherein the substrate 10 is an aluminum foil and the shunting structure 20 is of silver, the aluminum substrate can be removed by etching with NaOH etchant without damaging the silver shunting structure 20.

Figure 2D:
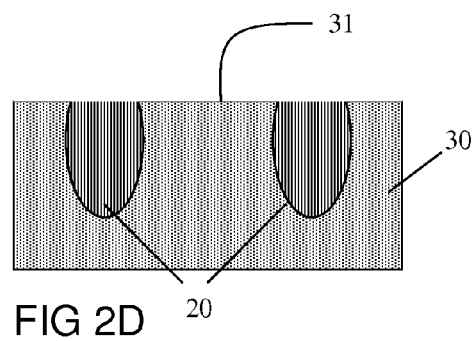

As shown in FIG. 2D, after the step S4 of removing the substrate 10, a substantially flat, free surface 31 remains that is formed by the barrier layer 30 and the shunting structure 20 that is embedded therein.

In step S5 a functional layer structure 40 is now deposited over the free surface 31 formed after removal of the substrate 10. In this case the functional layer structure 40 comprises a hole injection layer 42, here a PEDOT layer, a light emitting layer 44, and a cathode layer 46.

The light emitting layer 44 may typically comprise any organic electroluminescent ("EL") material, including, but not limited to, small molecule organic fluorescent compounds, fluorescent and phosphorescent metal complexes, conjugated polymers, and combinations or mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof.

Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and may further include combinations or mixtures thereof.

The choice of a particular material may depend on the specific application, potentials used during operation, or other factors. The light emitting layer 44 containing the electroluminescent organic material can be applied using any number of techniques including vapor deposition, solution processing techniques or thermal transfer. In another embodiment, an EL polymer precursor can be applied and then converted to the polymer, typically by heat or other source of external energy (e.g., visible light or UV radiation).

The cathode layer 46 is usually formed by a stack of sublayers for example Ca/Ag, Au/Al/Au, LiF/Ag/ITO, Sr/Ag, Ca/Al, Ba/Al, wherein the order in which the sublayers are mentioned indicates the order in which the materials are applied at the stack. For example, in the present case a Ba/Al stack is applied, wherein the barium sublayer here having a thickness of about 5 nm, is applied against the light emitting layer 44 and the aluminum sublayer, here having a thickness in the range of 100-400 nm, is applied on top of the barium sublayer.

Figure 2E:
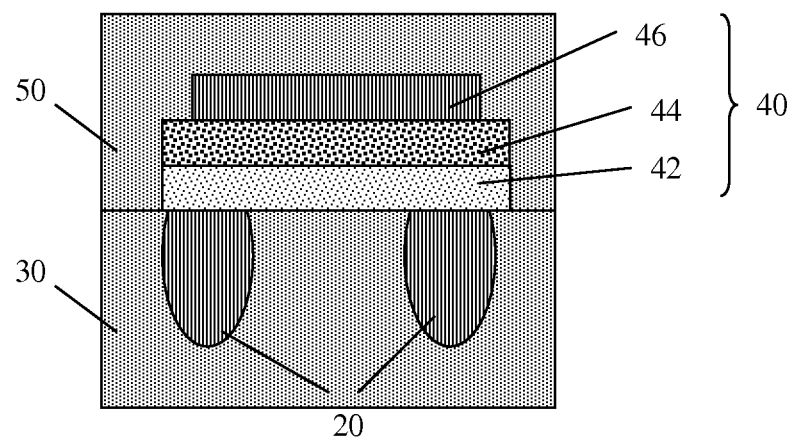

A second barrier layer 50 is applied that may be similar to the barrier layer 30. Alternatively another type of barrier layer may be applied, for example a barrier layer comprising a stack of inorganic sublayers of different materials that alternate each other. As shown in FIG. 2E, the first and the second barrier layer 30, 50 together encapsulate the functional layer structure 40 and the shunting structure 20 arranged thereon.

Figure 2F:
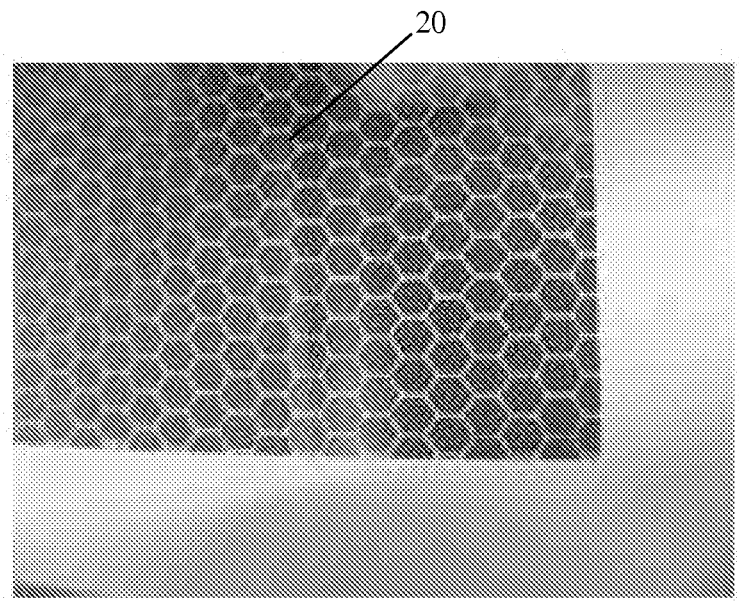
FIG. 2F is a photograph of a device obtained with the method of FIG. 2A to 2E,
FIGS. 3A to 3E illustrate a further method according to the first aspect of the present invention, therein

A photograph of the semifinished product shown in FIG. 2D used in the product so obtained is shown in FIG. 2F.

Figure 3A:
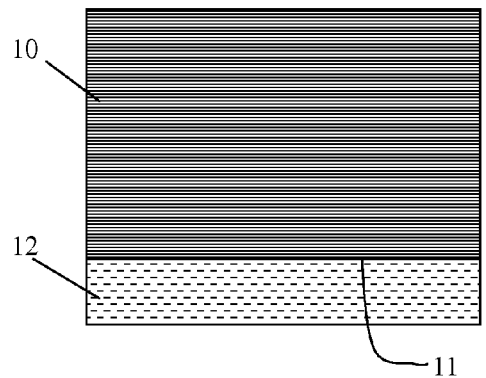
FIG. 3A illustrates a first step.
Figure 3B:
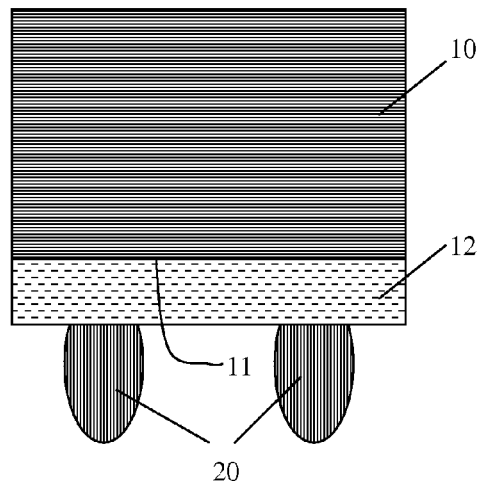
FIG. 3B illustrates a second step.

FIGS. 3A to 3E show a second embodiment of the method according to the first aspect of the invention. FIG. 3F is a photograph of a product obtained therewith. The method shown in FIGS. 3A to 3E differs from the method shown in FIGS. 2A to 2E by the additional step wherein at least one intermediate layer 12 is deposited at the first side 11 of the substrate 10 before overlying the substrate 10 with the electrically interconnected open shunting structure. The result of this additional step is illustrated in FIG. 3A. In this case the at least one intermediate layer 12 is a transparent electrically conductive layer, here a layer of indium tin oxide (ITO), but also other materials are suitable, such as IZO (Indium Zinc Oxide), ATO (Antimony Tin Oxide), Tin Oxide Nickel-Tungsten-Oxide, Indium doped Zinc Oxide, Magnesium-Indium-Oxide. As the intermediate layer 12 is applied at a temporary metal substrate 10, relatively high processing temperatures may be used, i.e. during an atmospheric pressure chemical vapour deposition (APCVD) process at a temperature of 550°, therewith obtaining a high quality electrode layer having a thickness in the range of 10 to 600 nm.

The electrically interconnected open shunting structure 20 is subsequently deposited at the first side 11 of the substrate 10, i.e. at the free surface of the intermediate layer 12.

Figure 3C:
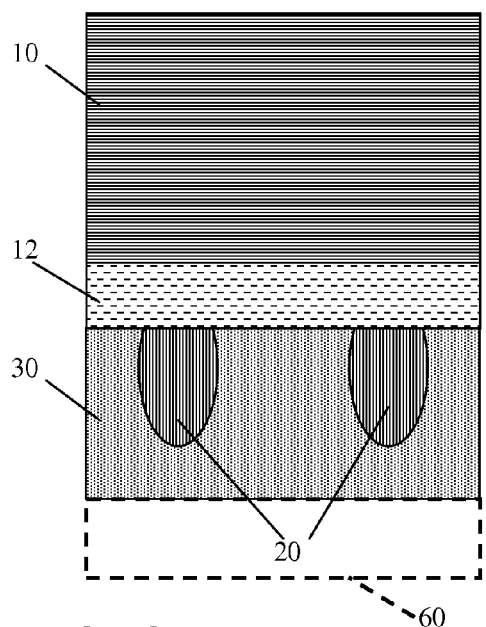
FIG. 3C illustrates a third step.

As in the other embodiment of the method according to the first aspect of the invention, the electrically interconnected open shunting structure 20 is embedded in a transparent layer 30, preferably a barrier layer, resulting in the semi-finished product shown in FIG. 3C. Optionally a polymer foil 60, e.g. a PEN or PET foil 60 as indicated by the dashed box, in FIG. 3C may be laminated at the free surface of the barrier layer 30.

Figure 3D:
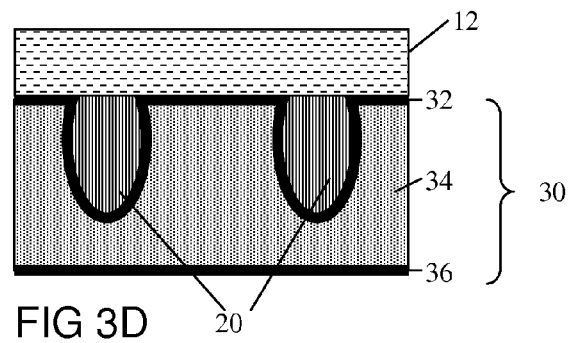
FIG. 3D illustrates a fourth step.

As in the other embodiment of the method according to the first aspect of the invention, the substrate 10 is removed from the embedded electrically interconnected open shunting structure 20, resulting in the intermediate product of FIG. 3D. FIG. 3D also shows in detail the sublayers 32, 34, 36 that form the transparent barrier layer 30. The first sublayer 32 is an inorganic layer, e.g. a layer of siliconoxide or silicon nitride having a thickness in the range of 10-1000 nm, preferably 100-300 nm. In this case the thickness is about 100 nm. The first sublayer 32 is deposited conformal with the shunting structure 20. The second sublayer 34 is a planarizing organic layer, e.g. a poly acrylate layer having a thickness in the range of 0.1 to 100 µm, preferably in the range of 5-50 µm, e.g. about 20 µm. The third layer 36 is also an inorganic layer, e.g. a layer of siliconoxide or silicon nitride having a thickness comparable to that of the first layer 32, e.g. 100 nm.

Figure 3H:
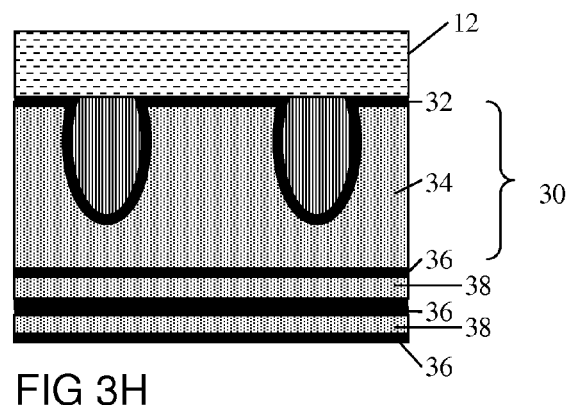
FIG. 3H illustrates a semifinished product in an alternative embodiment.

The stack may comprise further organic and inorganic sublayers that alternate each other, such as inorganic layers 36 and organic layers 38, as shown in FIG. 3H. In an embodiment the stack 30 comprises one or more of dyed organic layers to change the color of light output as desired. This is also applicable to the embodiment described with reference to FIG. 1.

Additionally a polymer film may be applied against the stack 30, e.g. by coating and curing to serve as a final substrate after removal of the temporary substrate 10.

Unlike the embodiment described with reference to FIGS. 2A to 2E, the intermediate layer 12 functions as an etch stop layer. This makes it possible to use a wider range of metals. Despite the choice of the metals for the temporary substrate 10 and the shunting structure 20, the temporary metal substrate 10 can be removed by etching without causing damage to the shunting structure 12, even if the same metal is used for the shunting structure 20 and the temporary substrate 10.

As in the embodiment shown in FIGS. 2A-2E subsequently a functional layer structure 40 is applied and a barrier layer 50 is applied.

A photograph of the product so obtained is shown in FIG. 3F. The device shown therein has an area of 9×9 cm. The intermediate layer 12 is an $SnO_2$:F layer having a thickness of 500 nm. The shunting structure 20 is obtained by inkjet printing of Ag. The shunting structure comprises mutually parallel lines having a width of 150 µm and a height of about 300 nm.

Various devices obtained with the method according to the invention and devices not according to the invention were simulated to determine the homogeneity of their light output. The results thereof are shown in FIG. 4.

Devices according to the invention obtainable with the embodiment of the method shown in FIG. 2A to 2E were simulated. These devices have an electrically interconnected open shunting structure 20 formed by mutually parallel shunting lines that extend over the full width of the device. The parallel shunting lines, mutually spaced at a distance of 2.5 mm, have a width of 70 µm a height of 5 µm.

Figure 4:
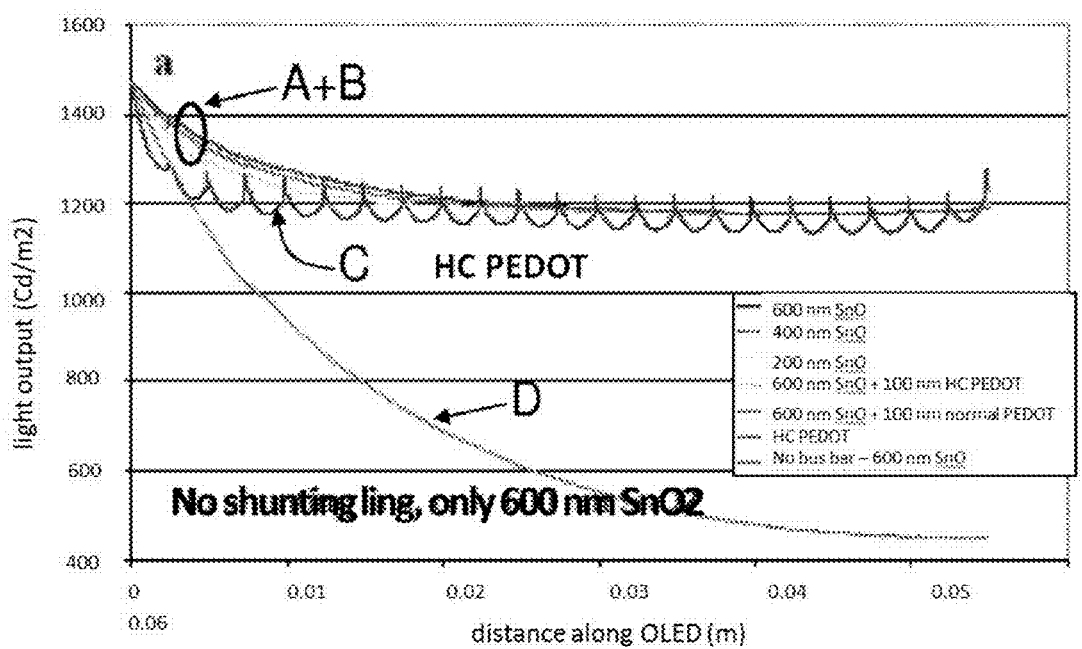
FIG. 4 illustrates a brightness as a function of the distance to a supply terminal for various devices according to the present invention and a device not according to the invention.

In FIG. 4 the capital "A" represents a simulation of a first variant of these devices according to the invention as shown in FIG. 3E with an intermediate, transparent electrically conductive layer 12 of SnO2 having a thickness in the range of 200 to 600 nm, but without a hole injection layer. The capital "B" represents a simulation of a second variant of these devices according to the invention with an additional hole injection layer of 100 nm between the transparent electrically conductive layer and the remainder of the functional structure. Two species were simulated, one with a hole injection layer with a relatively modest conductivity, namely a PEDOT layer with a conductivity of $1*10^4$ S/m and another one with a higher conductivity, namely a PEDOT layer with a conductivity of $2.5*10^4$ S/m. The capital C represents a simulation of a third variant of a device according to the present invention according to FIG. 2E. Therein the hole injection layer 42 was a PEDOT layer of 100 nm.

Also a device (D) not according to the invention was simulated, not having a shunting structure, but only having a transparent electrically conductive layer of SnO.

The results of the simulation are shown in FIG. 4 and present the light output in $Cd/m^2$ (vertical) as a function of the distance from the edge in m (horizontal) where a power supply terminal is mounted for the transparent electrode.

All devices substantially have the same brightness of 1500 $Cd/m^2$ at their edge.

The device (D) not according to the invention shows a rapid decline of the brightness from about 1500 $Cd/m^2$ at its edge, to about 900 $Cd/m^2$ at a distance of 1 cm from the edge. At a distance of 5 cm from the edge the brightness is reduced to about 500 $Cd/m^2$, i.e. to about ⅓ of the brightness at the edge.

The devices according to variant A and B merely show a relatively modest reduction of the brightness to about 1300 $Cd/m^2$, i.e. 13%. In a range of about 2 cm to 6 cm from the edge with the external power supply, the brightness remains substantially constant at a level of 1200 $Cd/m^2$. The brightness is slightly positively correlated with the thickness of the transparent electrically conductive layer 12, but the differences are modest.

The device according to variant C of the invention shows a decline of the brightness to about 1200 $Cd/m^2$ at a distance of 0.4 mm from the edge, e.g. a decline of 20%. From that distance of 0.4 mm to a distance of about 6 cm the brightness maintains this level of 1200 $Cd/m^2$.

Accordingly, the measure of the present invention provides for a novel and inventive way to apply a shunting structure that results in a clear improvement of the homogeneity of the brightness of the device.

If the device only has to radiate or has to receive radiation unilaterally, the electrode 46 does not need to be transparent, and hence may be as thick as required to have a predetermined conductivity. If however it is desired that the device can radiate on both sides or receive radiation from both sides, the thickness of the electrode should be modest to prevent that it absorbs too much radiation entering or leaving the device. In that case a sufficiently low-impedance electric conduction to an external power line can be obtained in an embodiment of the method according to the first aspect with the step of overlying the first side of the substrate with an additional electrically interconnected open shunting structure. The result is that the first side of the substrate is provided with a first and a second electrically interconnected open shunting structure 23, 24 that are mutually isolated, for example as shown in FIG. 1D or 1E.

Figure 5A:
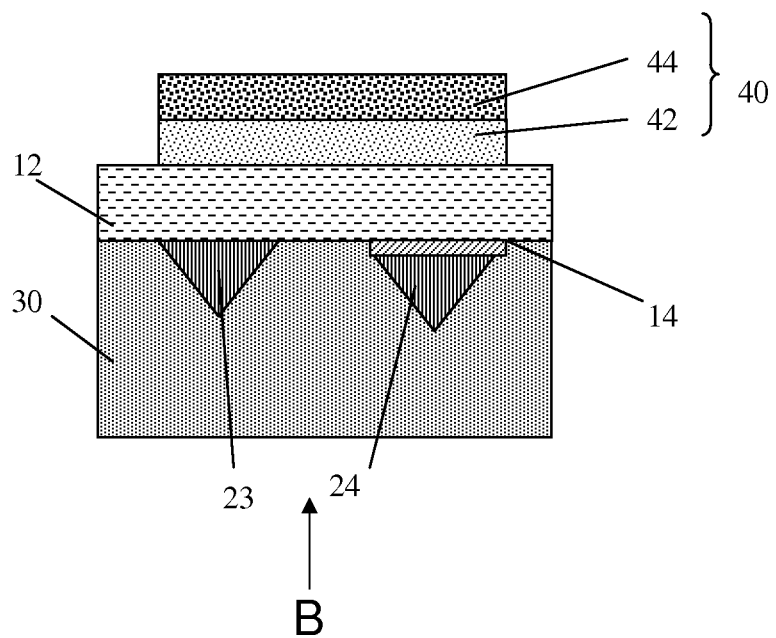
FIGS. 5A to 5F illustrate a still further embodiment of a method according to the first aspect of the invention, therein
Figure 5B:
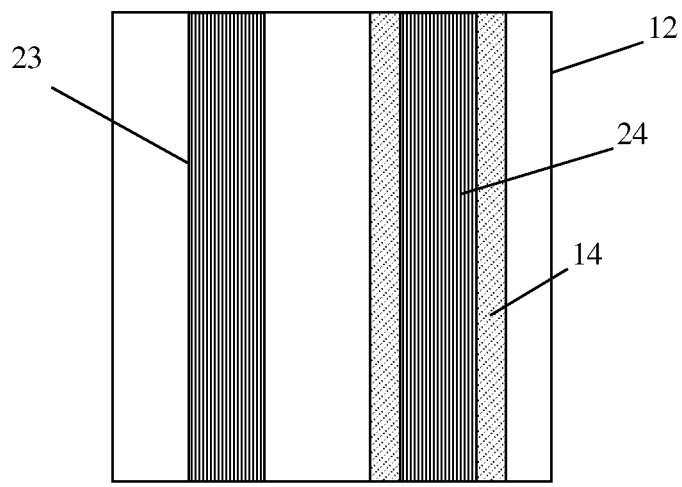

FIG. 5A shows a portion of a semifinished product provided with a first and a second electrically interconnected open shunting structure 23, 24. FIG. 5B shows a bottom view according to B in FIG. 5A. The shunting structures 23, 24 are mutually isolated by an insulating layer 14, e.g. a metal oxide layer, e.g. a layer of Al2O3 that was deposited at the intermediate layer 12 before applied the shunting structure 24. Shunting structures 23, 24 are preferably applied simultaneously, e.g. by printing.

In the situation shown in FIGS. 5A, 5B the shunting structure 23 is electrically connected to the transparent electrically conductive layer 12. The shunting structure may now be connected to the electrically conductive layer 46 for example by the steps shown in FIGS. 5C and 5D.

Figure 5C:
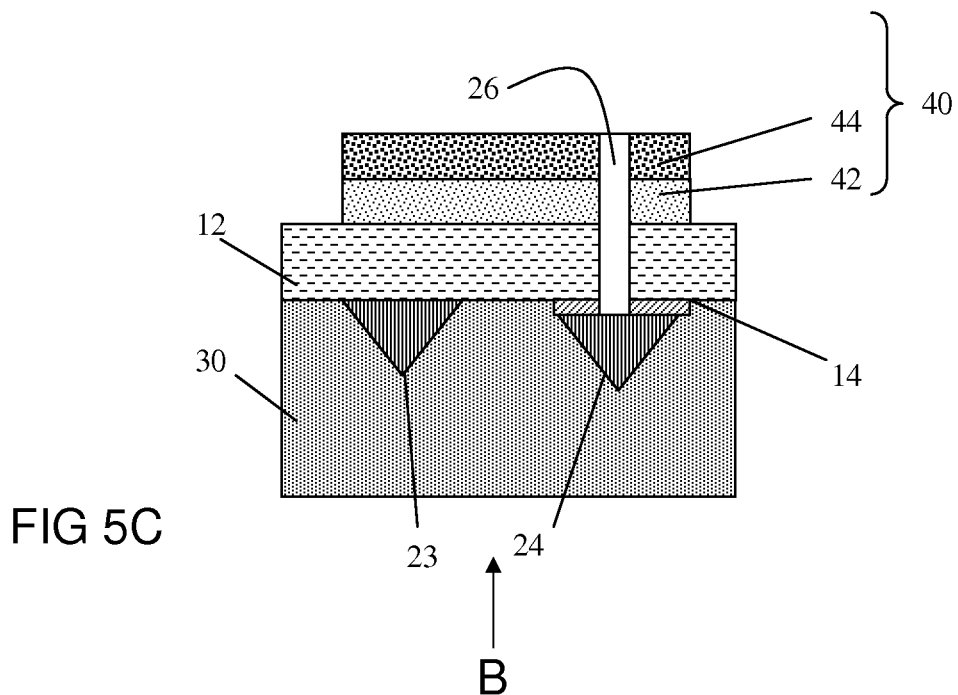
Figure 5D:
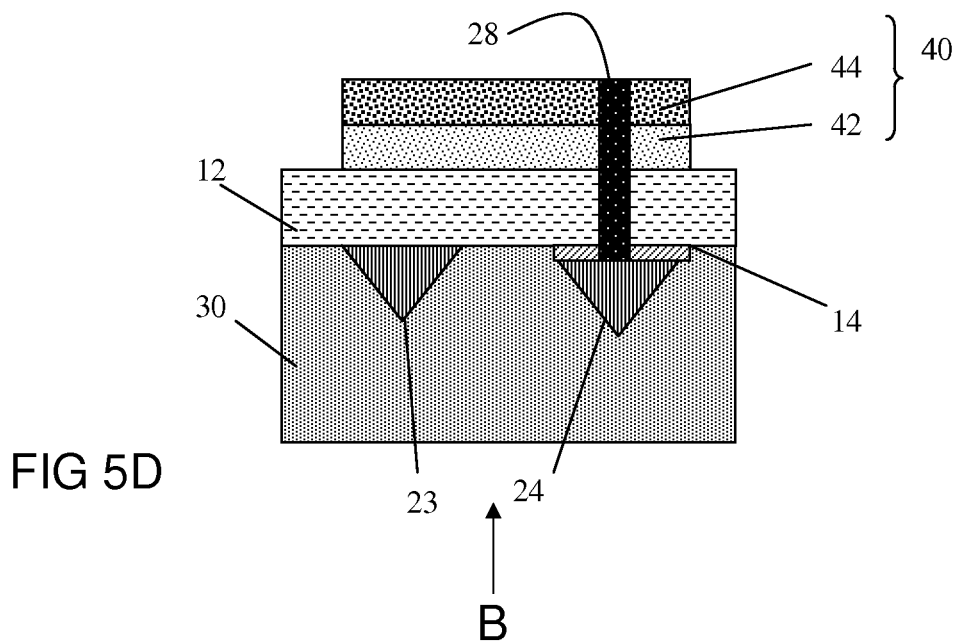

In a step shown in FIG. 5C, a hole 26 is drilled through the functional layers 44, 42, the intermediate layer 12 and the insulating layer 14 to the shunting structure 24. The hole 26 is subsequently filled (as shown in FIG. 5D) with an electrically conductive paste forming a transverse electric conductor 28. Suitable electrically conductive pasts for this purpose are for example metal filled polymer pasts, e.g. epoxies, acrylates or silicones filled with Ag or Cu.

Figure 5E:
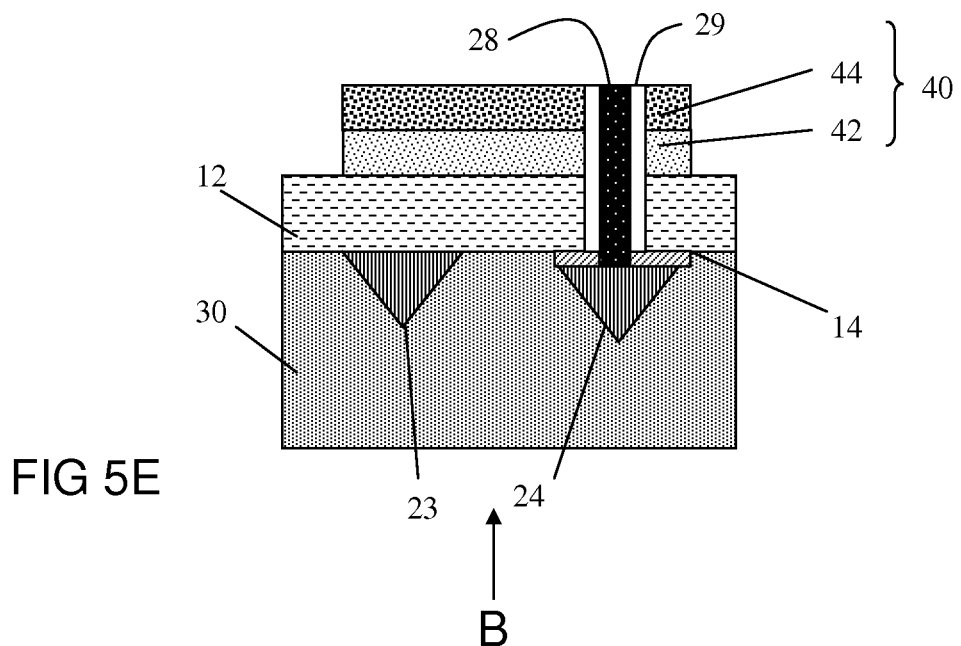

In a next step as shown in FIG. 5E a torus shaped hole 29 around the transverse electrical conductor 28 is drilled to insulate the transverse electrical conductor 28 from the transparent electrically conductive layer 12. The torus shaped hole 29 around the transverse electrical conductor 28 may subsequently be filled with an insulating material, e.g. metal free epoxies, acrylates or silicons. Alternatively a cylindrical hole may drilled first having an cylindrical surface coinciding with the outer surface of the torus shaped hole 29 and extending to the insulating layer 14 or to the shunting structure 24. Subsequently this cylindrical hole may be filled with an insulating paste, e.g. a metal free epoxy, acrylate or silicon. After curing a hole may be drilled within the insulating paste that coincides with the shape 26 of FIG. 5C. This hole within the insulating paste may subsequently be filled with an electrically conductive past to form the transverse electrical conductor 28. Therewith also the semifinished product of FIG. 5E is obtained.

Figure 5F:
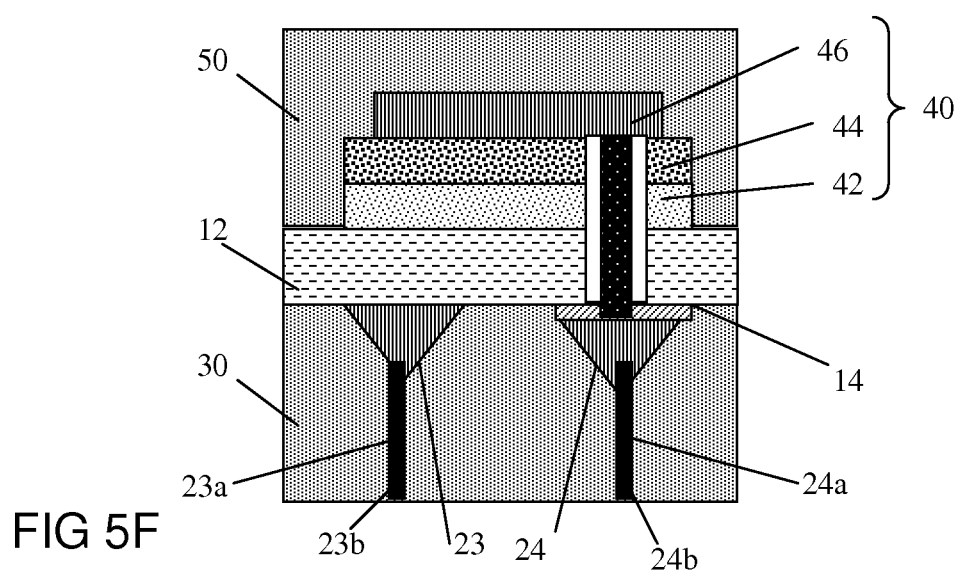

As shown in FIG. 5F after applying the electrically conductive layer 46 at the preceding layer 44, this electrically conductive layer 46 is electrically connected via the transverse electrical conductor 46 to the shunting structure 24. Although only one transverse electrical conductive element 46 is shown, the device may have a plurality of transverse electrical conductive elements spread to form electric contacts all over the surface of the electrically conductive layer 46. Therewith the electrically conductive layer 46 does not need to have a very low conductance itself, and accordingly can be a relatively thin layer, that has a good transmission for radiation emitted by the device or radiation to be received by the device. As shown in FIG. 5F, the shunting structures 23 and 24 are couple via a respective transverse conductor 23a, 24a to a respective external contact 23b, 24b. The respective transverse conductors 23a, 24a may be provided by drilling respective holes and filling these with an electrically conductive paste. As the shunting structures 23, 24 can have a relatively high conductance one contact for each of the shunting structures 23, 24 suffices. For very large area devices it could be considered to provide a plurality of electric contacts for each shunting structure 23, 24.

It is not necessary that the substrate is a metal or an alloy of metals. Alternatively a polymer foil may be used as the temporary substrate. The polymer may be removed in step S4 using a solvent. For example the temporary substrate may comprise a layer of sputtered aluminum onto a polymer foil or a water dissolvable layer onto a polymer foil. An example thereof is a temporary substrate comprising a stack PEDOT/Al/PEN. This temporary stack can be easily removed by exposure to water. Another example of a temporary substrate is a stack formed by LEP/PEDOT/Glass. The shunting structure can be peeling off from this temporary substrate after it is embedded in the barrier structure.

However using a metal foil as the temporary substrate has the advantage that relatively high process temperatures may be used.

Although the present invention has been described in detail for an embodiment wherein the opto-electric device is an OLED, the device may alternatively be another opto-electric device, such as a photovoltaic cell. In that case the opto-electric layer structure comprises at least one photo-voltaic layer that transforms photon radiation into an electrical current. In again another embodiment the device is an electro chrome mirror. In that case the opto-electric layer structure comprises at least one layer that has an electrically controllable transmission.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. In the claims the word "comprising" does not exclude other elements or steps, and the indefinite article "a" or "an" does not exclude a plurality. A single component or other unit may fulfil the functions of several items recited in the claims. The mere fact that certain measures are recited in mutually different claims does not indicate that a combination of these measures cannot be used to advantage. Any reference signs in the claims should not be construed as limiting the scope.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The invention claimed is:

1. Method of manufacturing an opto-electric device having a support, comprising the steps of
providing a substrate (10),
overlaying a first main side of the substrate with an electrically interconnected open structure (20) formed of elongate elements,
embedding the electrically interconnected open structure in a transparent barrier layer (30), wherein the barrier layer is a stack subsequently comprising a first inorganic sublayer, an organic sublayer and a second inorganic sublayer, wherein the organic sublayer is a polymer layer having a thickness of at least 1 μm,
removing the substrate from the embedded electrically interconnected open structure, and
depositing a functional layer structure (40) over a free surface formed after removal of the substrate, wherein said organic sublayer serves as the support.

2. Method according to claim 1, comprising the step of depositing at least one intermediate layer at the first side of the substrate before overlaying that side of the substrate with the electrically interconnected open structure.

3. Method according to claim 2, wherein the at least one intermediate layer is a transparent electrically conductive layer.

4. Method according to claim 1, wherein the substrate is a metal substrate and the metal substrate is removed by etching.

5. Method according to claim 1, wherein the substrate is provided with a soluble layer against which the structure is applied and wherein the substrate is removed by dissolving the soluble layer.

6. Method according to claim 1, wherein the substrate is provided with a release layer against which the structure is applied and wherein the substrate is removed by peeling of the embedded open structure from the substrate with the release layer.

7. Method according to claim 4, wherein the electrically interconnected open structure is formed of a further metal, the further metal being different from the metal used for the temporary substrate, and wherein the further metal is substantially insensitive for the etching agent used.

8. Method according to claim 1, wherein the electrically interconnected open structure is provided by electro deposition.

9. Method according to claim 1, wherein the electrically interconnected open structure is provided by
depositing a liquid substance at the substrate in an interconnected open structure,
curing the liquid substance, the interconnected open structure formed by the cured liquid substance being electrically conductive.

10. Method according to claim 1, wherein the electrically interconnected open structure is provided by depositing a layer of a metal at the substrate and patterning the deposited layer.

11. Method according to claim 1, wherein a polymer foil is laminated over the transparent layer.

12. Method according to claim 1, wherein a polymer film is applied over the transparent layer by coating and curing.

13. Method according to claim 1, wherein the thickness of said polymer layer is at least 5 μm.

14. Method according to claim 13, wherein the thickness of said polymer layer is at most 200 μm.

15. Method according to claim 13, wherein the thickness of said polymer layer is at most 100 μm.

16. Method according to claim 13, wherein the thickness of said polymer layer is at most 50 μm.

* * * * *

UNITED STATES PATENT AND TRADEMARK OFFICE
CERTIFICATE OF CORRECTION

PATENT NO. : 8,987,019 B2  
APPLICATION NO. : 13/389141  
DATED : March 24, 2015  
INVENTOR(S) : Antonius Maria Bernardus van Mol et al.

It is certified that error appears in the above-identified patent and that said Letters Patent is hereby corrected as shown below:

On the Title Page

Change (73) Assignee to "Nederlandse Organisatie voor toegepast-natuurwetenschappelijk Onderzoek TNO"

Signed and Sealed this  
Fourteenth Day of July, 2015

Michelle K. Lee  
*Director of the United States Patent and Trademark Office*